(12) United States Patent
Lee et al.

(10) Patent No.: US 8,406,342 B2
(45) Date of Patent: Mar. 26, 2013

(54) METHODS AND SYSTEMS FOR IMPROVING FRAME DECODING PERFORMANCE USING KNOWN INFORMATION

(75) Inventors: Chun Woo Lee, San Ramon, CA (US); Jong Hyeon Park, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 825 days.

(21) Appl. No.: 12/142,770

(22) Filed: Jun. 19, 2008

(65) Prior Publication Data

US 2009/0316823 A1    Dec. 24, 2009

(51) Int. Cl.
*H03K 9/00* (2006.01)
*H04L 27/00* (2006.01)

(52) U.S. Cl. ........ 375/316; 455/130

(58) Field of Classification Search ........ 375/316
See application file for complete search history.

(56) References Cited

U.S. PATENT DOCUMENTS

| | | | |
|---|---|---|---|
| 6,320,914 B1 * | 11/2001 | Dent | 375/302 |
| 6,532,567 B2 | 3/2003 | Ino | |
| 2003/0145269 A1 * | 7/2003 | Kuo et al. | 714/749 |
| 2004/0141523 A1 * | 7/2004 | Bhushan et al. | 370/469 |
| 2004/0141525 A1 * | 7/2004 | Bhushan et al. | 370/473 |
| 2007/0089037 A1 | 4/2007 | Jiang | |
| 2007/0124654 A1 | 5/2007 | Smolinske et al. | |
| 2007/0143110 A1 * | 6/2007 | Acero et al. | 704/251 |
| 2007/0207812 A1 * | 9/2007 | Borran et al. | 455/452.1 |
| 2009/0175387 A1 * | 7/2009 | Park et al. | 375/340 |

FOREIGN PATENT DOCUMENTS

| | | |
|---|---|---|
| CN | 1534878 A | 10/2004 |
| CN | 1731686 A | 2/2006 |
| EP | 1467492 | 10/2004 |
| EP | 1885069 A1 | 2/2008 |
| RU | 2298283 C2 | 4/2007 |
| WO | WO2007021224 | 2/2007 |
| WO | 2007065115 A2 | 6/2007 |

OTHER PUBLICATIONS

International Search Report and Written Opinion—PCT/US2009/047716—ISA/EPO—Mar. 25, 2010.
Zhou J., "A Method for iterative channel estimation of an overlapped train sequence OFDM system", Chinese Journal of Electronics, vol. 35, No. 6A, Jun. 29, 2007.

\* cited by examiner

*Primary Examiner* — Erin File
(74) *Attorney, Agent, or Firm* — Charles Chesney

(57) ABSTRACT

A method and apparatus for decoding encoded data bits of a wireless communication transmission are provided. A set of a-priori bit values corresponding to known bit values of a response message expected to be transmitted in response to a previously transmitted message. Example expected response messages include clear to send (CTS) messages transmitted in response to request to send (RTS) messages and positive acknowledgement (ACK) messages transmitted in response to messages with data payloads.

20 Claims, 14 Drawing Sheets

METHODS AND SYSTEMS FOR IMPROVING FRAME DECODING PERFORMANCE USING KNOWN INFORMATION

BACKGROUND

1. Technical Field

Certain embodiments of the present disclosure generally relate to wireless communications and, more particularly, to decoding wireless transmissions.

2. Description of the Related Art

The rapid growth in wireless communications services, such as broadband Internet access, wireless local area network access point ("hot spots"), and streaming media applications, has lead to an increasing demand for higher data rates. Advancements in multiplexing schemes, such as Orthogonal Frequency Division Multiplexing (OFDM) and Orthogonal Frequency Division Multiple Access (OFDMA), are important for next generation wireless communications systems. This is due to the fact that such schemes can provide many advantages including modulation efficiency, spectrum efficiency, flexibility (e.g., allowing differentiated quality of service), and strong multi-path immunity over conventional single carrier modulation schemes.

OFDM and OFDMA systems often utilize convolutional encoders at the transmitter to provide for error correction. Using a convolutional code, an m-bit string of data is transformed into n-bits, where m/n is a coding rate. Decoders, such as Viterbi decoders, are used at the receiver to decode the received encoded n-bits to recover the original m-bit sequence. This scheme often allows the original m-bit sequence to be decoded correctly, even if one or more of the encoded n-bits is not received correctly, thus resulting in reductions in bit error rate.

However, with the ever increasing reliability and performance demands of wireless services, there is an ongoing need to continuously reduce bit error rates.

SUMMARY

A method and apparatus for decoding encoded data bits of a wireless communication transmission for a response message expected to be transmitted in response to a transmitted message are provided.

Certain embodiments provide a method for decoding encoded data bits of a wireless communication transmission for a response message expected to be transmitted in response to a transmitted message. The method generally includes generating a hypothesis specifying a set of bit values of the encoded data bits based on a-priori information (API) regarding the response message, wherein the a-priori information is extracted from the transmitted message and decoding the transmission by eliminating from consideration sets of decoded bits that are inconsistent with the specified bit values and selecting, as output, decoded bits that are consistent with the bit values specified by the hypothesis.

Certain embodiments provide a receiver capable of decoding encoded data bits of a wireless communication transmission for a response message expected to be transmitted in response to a transmitted message. The receiver generally includes logic for generating a hypothesis specifying a set of bit values of the encoded data bits based on a-priori information regarding the response message, wherein the a-priori information is extracted from the transmitted message and logic for decoding the transmission by eliminating from consideration sets of decoded bits that are inconsistent with the specified bit values and selecting, as output, decoded bits that are consistent with the bit values specified by the hypothesis.

Certain embodiments provide an apparatus for decoding encoded data bits of a wireless communication transmission for a response message expected to be transmitted in response to a transmitted message. The apparatus generally includes means for generating a hypothesis specifying a set of bit values of the encoded data bits based on a-priori information regarding the response message, wherein the a-priori information is extracted from the transmitted message and means for decoding the transmission by eliminating from consideration sets of decoded bits that are inconsistent with the specified bit values and selecting, as output, decoded bits that are consistent with the bit values specified by the hypothesis.

Certain embodiments provide a computer-readable medium containing instructions for a program for decoding encoded data bits of a wireless communication transmission for a response message expected to be transmitted in response to a transmitted message. When executed by a processor, the program performs operations generally including generating a hypothesis specifying a set of bit values of the encoded data bits based on a-priori information regarding the response message, wherein the a-priori information is extracted from the transmitted message and decoding the transmission by eliminating from consideration sets of decoded bits that are inconsistent with the specified bit values and selecting, as output, decoded bits that are consistent with the bit values specified by the hypothesis.

BRIEF DESCRIPTION OF THE DRAWINGS

So that the manner in which the above recited features of the present disclosure can be understood in detail, a more particular description of certain embodiments, briefly summarized above, may be had by reference to certain embodiments of the present disclosure, some of which are illustrated in the appended drawings. It is to be noted, however, that the appended drawings illustrate only certain embodiments and are therefore not to be considered limiting of its scope, for the disclosure may admit to other equally effective embodiments.

DETAILED DESCRIPTION

Figure 1:
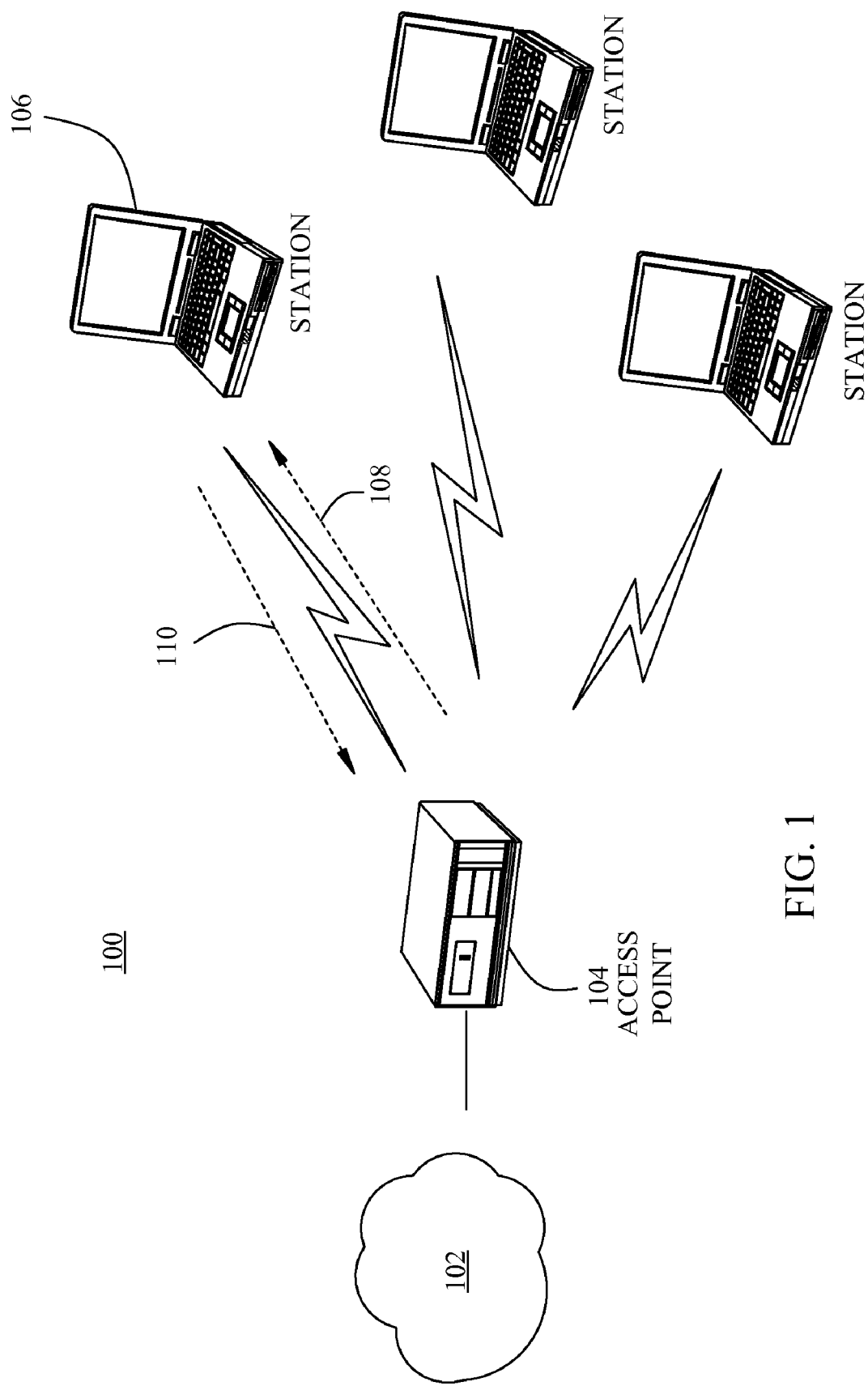
FIG. 1 illustrates an example wireless system in accordance with certain embodiments of the present disclosure.

The present disclosure generally provides techniques and apparatus for decoding convolutionally encoded wireless transmissions using a-priori information (API) regarding a transmission. The a-priori information may be used to effectively reduce the population of possible decoded bit streams by eliminating those that include bits that are not consistent with the a-priori information. By removing these "known wrong" paths that lead to erroneous data, decoded bit error rates may be improved in some situations.

As used herein, the term a-priori information (API) generally refers to information known beforehand, such as, information proceeding from a known or assumed cause to a necessarily related effect. As will be described in greater detail below, examples of a-priori information related to a transmission include known information bits in certain messages. Examples of such known information bits include reserved bits with values, as specified by a standard or bits that have known or predictable values based on their value in previous transmissions. These known bit positions and bit values (herein referred to as "API values") may be used in decoding process to improve decoding performance by excluding paths that correspond to values that are in contrast to the API values.

Exemplary Wireless Communication System

The methods and apparatus of the present disclosure may be utilized in a broadband wireless communication system. The term "broadband wireless" refers to technology that provides wireless, voice, Internet, and/or data network access over a given area. The methods and apparatus described herein may be applied in a variety of different communications systems, including wireless local area network (WLAN) systems of access points (APs) and subscriber stations (STAs) that comply with the IEEE 802.11 family of standards which is also known as Wi-Fi.

WLAN is a standards-based broadband wireless technology that provides high-throughput broadband connections over short distances.

WLAN is based on OFDM (orthogonal frequency-division multiplexing) technology. OFDM is a digital multi-carrier modulation technique that has recently found wide adoption in a variety of high-data-rate communication systems. With OFDM, a transmit bit stream is divided into multiple lower-rate sub-streams. Each sub-stream is modulated with one of multiple orthogonal sub-carriers and sent over one of a plurality of parallel sub-channels.

The rapid growth in wireless internets and communications has led to an increasing demand for high data rate in the field of wireless communications services. OFDM/OFDMA systems are today regarded as one of the most promising research areas and as a key technology for the next generation of wireless communications. This is due to the fact that OFDM/OFDMA modulation schemes can provide many advantages such as modulation efficiency, spectrum efficiency, flexibility, and strong multipath immunity over conventional single carrier modulation schemes.

IEEE 802.11x is a mature but still evolving standard organization to define an air interface for wireless local area networks (WLAN). The OFDM physical layer of the several physical layers is the most popular in the WLAN areas respectively.

FIG. 1 illustrates an example of a wireless communication system 100. The wireless communication system 100 may be a broadband wireless communication system. The wireless communication system 100 may include a network 102 (e.g., a local area network and/or the Internet) and a number of stations 106, each of which is provided access to the network 102 by an access point 104. The access point 104 may be a fixed station (e.g., a router) with a connection to the network that communicates wirelessly with the stations 106. The base station 104 may alternatively be referred to as an base station, a Node B, or some other terminology.

FIG. 1 depicts various stations 106 dispersed throughout the system 100. The stations 106 may be fixed (i.e., stationary) or mobile. The stations 106 may alternatively be referred to as remote stations, access terminals, terminals, subscriber units, mobile stations, stations, user equipment, etc. The stations 106 may be wireless devices, such as cellular phones, personal digital assistants (PDAs), handheld devices, wireless modems, laptop computers, personal computers, etc.

A variety of algorithms and methods may be used for transmissions in the wireless communication system 100 between the access point 104 and the stations 106. For example, signals may be sent and received between the access point 104 and the stations 106 in accordance with OFDM/OFDMA techniques. If this is the case, the wireless communication system 100 may be referred to as an OFDM/OFDMA system.

A communication link that facilitates transmission from an access point (AP) 104 to a station 106 may be referred to as a downlink 108, and a communication link that facilitates transmission from a station 106 to an access point 104 may be referred to as an uplink 110. Alternatively, a downlink 108 may be referred to as a forward link or a forward channel, and an uplink 110 may be referred to as a reverse link or a reverse channel.

For some embodiments, the access point 104 within a wireless communication system 100 may utilize antennas that concentrate the flow of power in a particular direction in an effort to improve reliability of communications with one or more of the stations 106. Such antennas may be referred to as directional antennas.

While an example Wi-Fi system has been described above, the techniques described herein are also applicable to a variety of other wireless communications systems, such as WiMAX systems designed in accordance with IEEE 802.16 standards.

Figure 2:
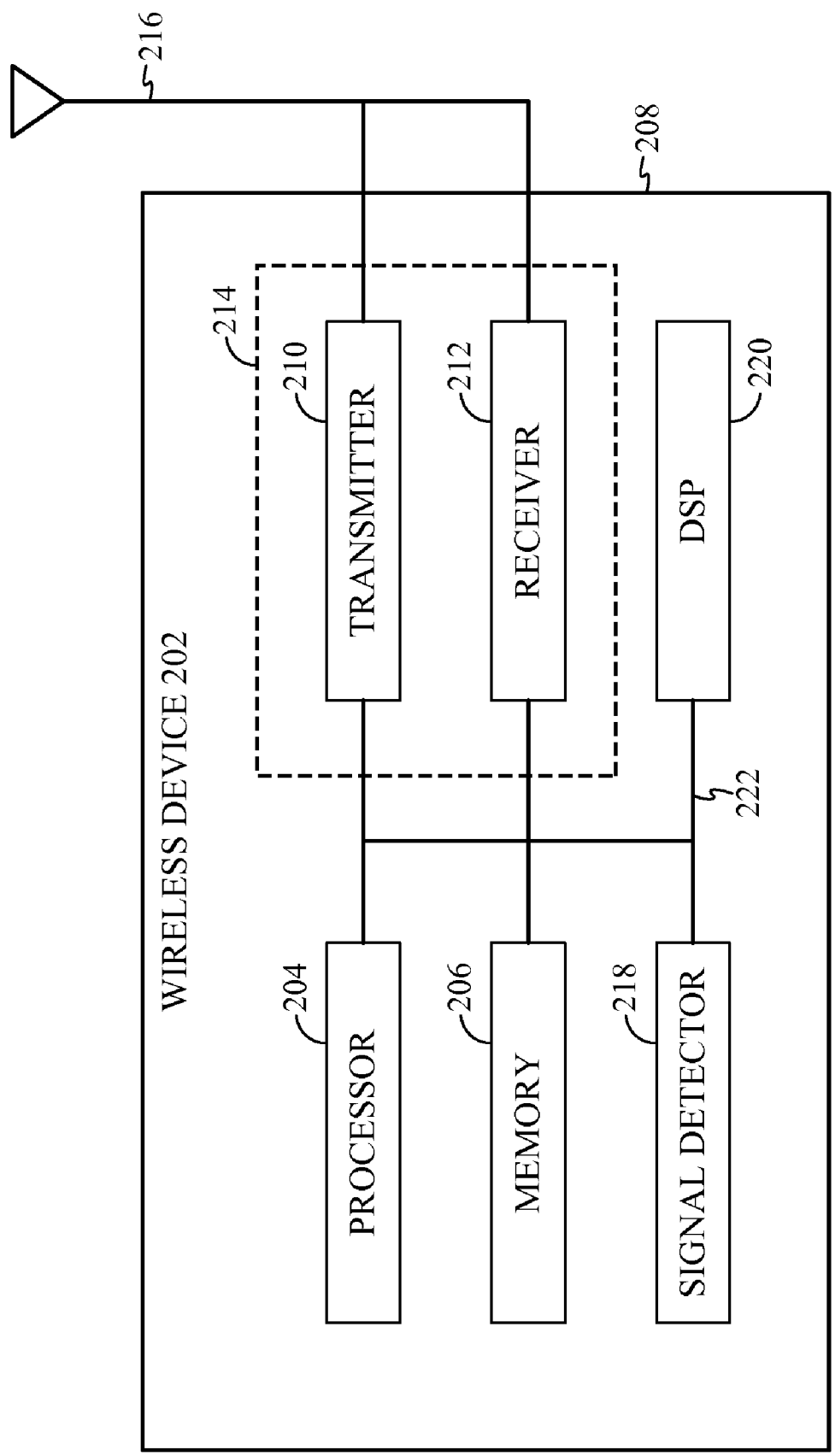
FIG. 2 is a block diagram of a wireless device in accordance with certain embodiments of the present disclosure.

FIG. 2 illustrates various components that may be utilized in a wireless device 202. The wireless device 202 is an example of a device that may be configured to implement the various methods described herein. The wireless device 202 may be a base station, mobile station, an access point 104, or a station 106.

The wireless device 202 may include a processor 204 which controls operation of the wireless device 202. The processor 204 may also be referred to as a central processing unit (CPU). Memory 206, which may include both read-only memory (ROM) and random access memory (RAM), provides instructions and data to the processor 204. A portion of the memory 206 may also include non-volatile random access memory (NVRAM). The processor 204 typically performs logical and arithmetic operations based on program instructions stored within the memory 206. The instructions in the memory 206 may be executable to implement the methods described herein.

The wireless device 202 may also include a housing 208 that may include a transmitter 210 and a receiver 212 to allow transmission and reception of data between the wireless device 202 and a remote location. The transmitter 210 and receiver 212 may be combined into a transceiver 214. An antenna 216 may be attached to the housing 208 and electrically coupled to the transceiver 214. The wireless device 202 may also include (not shown) multiple transmitters, multiple receivers, multiple transceivers, and/or multiple antennas.

The wireless device 202 may also include a signal detector 218 that may be used in an effort to detect and quantify the level of signals received by the transceiver 214. The signal detector 218 may detect such signals as total energy, pilot energy per pseudonoise (PN) chips, power spectral density, and other signals. The wireless device 202 may also include a digital signal processor (DSP) 220 for use in processing signals.

The various components of the wireless device 202 may be coupled together by a bus system 222, which may include a power bus, a control signal bus, and a status signal bus in addition to a data bus.

Figure 3:
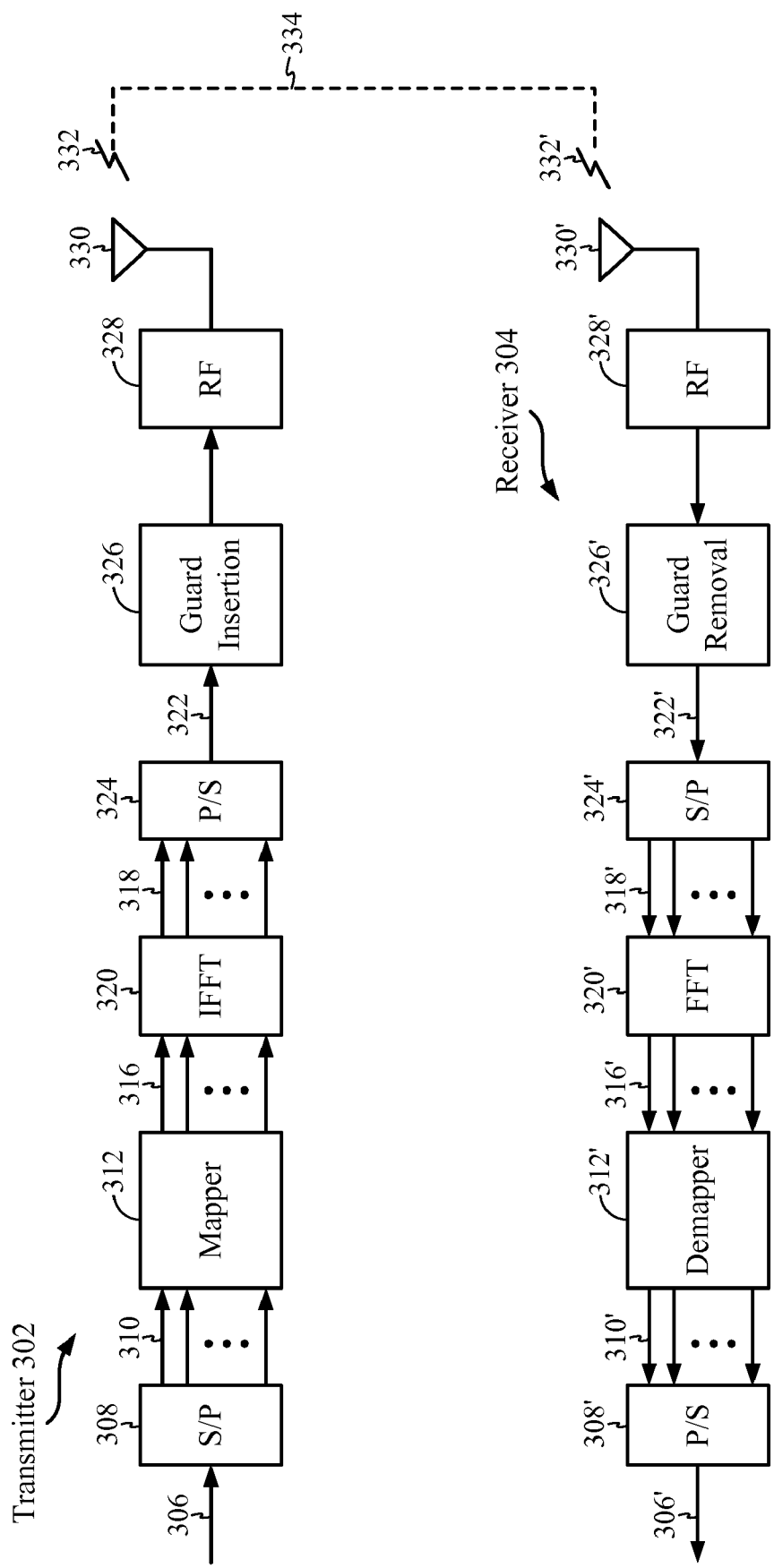
FIG. 3 illustrates a block diagram of a receiver and a block diagram of a transmitter in accordance with certain embodiments of the present disclosure.

FIG. 3 illustrates an example of a transmitter 302 that may be used within a wireless communication system 100 that utilizes OFDM/OFDMA. Portions of the transmitter 302 may be implemented in the transmitter 210 of a wireless device 202. The transmitter 302 may be implemented in an access point 104 for transmitting data 306 to a station 106 on a downlink 108. The transmitter 302 may also be implemented in a user terminal 106 for transmitting data 306 to an access point 104 on an uplink 110.

Data 306 to be transmitted is shown being provided as input to a serial-to-parallel (S/P) converter 308. The S/P converter 308 may split the transmission data into N parallel data streams 310.

The N parallel data streams 310 may then be provided as input to a mapper 312. The mapper 312 may map the N parallel data streams 310 onto N constellation points. The mapping may be done using some modulation constellation, such as binary phase-shift keying (BPSK), quadrature phase-shift keying (QPSK), 8 phase-shift keying (8PSK), quadrature amplitude modulation (QAM), etc. Thus, the mapper 312 may output N parallel symbol streams 316, each symbol stream 316 corresponding to one of the N orthogonal subcarriers of the inverse fast Fourier transform (IFFT) 320. These N parallel symbol streams 316 are represented in the frequency domain and may be converted into N parallel time domain sample streams 318 by an IFFT component 320.

A brief note about terminology will now be provided. N parallel modulations in the frequency domain are equal to N modulation symbols in the frequency domain, which are equal to N mapping plus N-point IFFT in the frequency domain, which is equal to one (useful) OFDM symbol in the time domain, which is equal to N samples in the time domain. One OFDM symbol in the time domain, $N_s$, is equal to $N_{cp}$ (the number of guard samples per OFDM symbol) +N (the number of useful samples per OFDM symbol).

The N parallel time domain sample streams 318 may be converted into an OFDM/OFDMA symbol stream 322 by a parallel-to-serial (P/S) converter 324. A guard insertion component 326 may insert a guard interval between successive OFDM/OFDMA symbols in the OFDM/OFDMA symbol stream 322. The output of the guard insertion component 326 may then be upconverted to a desired transmit frequency band by a radio frequency (RF) front end 328. An antenna 330 may then transmit the resulting signal 332.

FIG. 3 also illustrates an example of a receiver 304 that may be used within a wireless communication system 100 that utilizes OFDM/OFDMA. Portions of the receiver 304 may be implemented in the receiver 212 of a wireless device 202. The receiver 304 may be implemented in a user terminal 106 for receiving data 306 from a base station or access point 104 on a downlink 108. The receiver 304 may also be implemented in a base station or access point 104 for receiving data 306 from a user terminal or station 106 on an uplink 110.

The transmitted signal 332 is shown traveling over a wireless channel 334. When a signal 332' is received by an antenna 330', the received signal 332' may be downconverted to a baseband signal by an RF front end 328'. A guard removal component 326' may then remove the guard interval that was inserted between OFDM/OFDMA symbols by the guard insertion component 326.

The output of the guard removal component 326' may be provided to an S/P converter 324'. The S/P converter 324' may divide the OFDM/OFDMA symbol stream 322' into the N parallel time-domain symbol streams 318', each of which corresponds to one of the N orthogonal sub-carriers. A fast Fourier transform (FFT) component 320' may convert the N parallel time-domain symbol streams 318' into the frequency domain and output N parallel frequency-domain symbol streams 316'.

A demapper 312' may perform the inverse of the symbol mapping operation that was performed by the mapper 312, thereby outputting N parallel data streams 310'. A P/S converter 308' may combine the N parallel data streams 310' into a single data stream 306'. Ideally, this data stream 306' corresponds to the data 306 that was provided as input to the transmitter 302.

Those skilled in the art will recognize that, while the front end interface components may be different, transmitters and receivers will have similar encoding and decoding components that may perform similar operations across a variety of different wireless communications systems. Thus, the techniques presented herein may be utilized in a variety of different wireless systems, including WiMAX and WLAN systems.

A-Priori Decoding

Figure 4A:
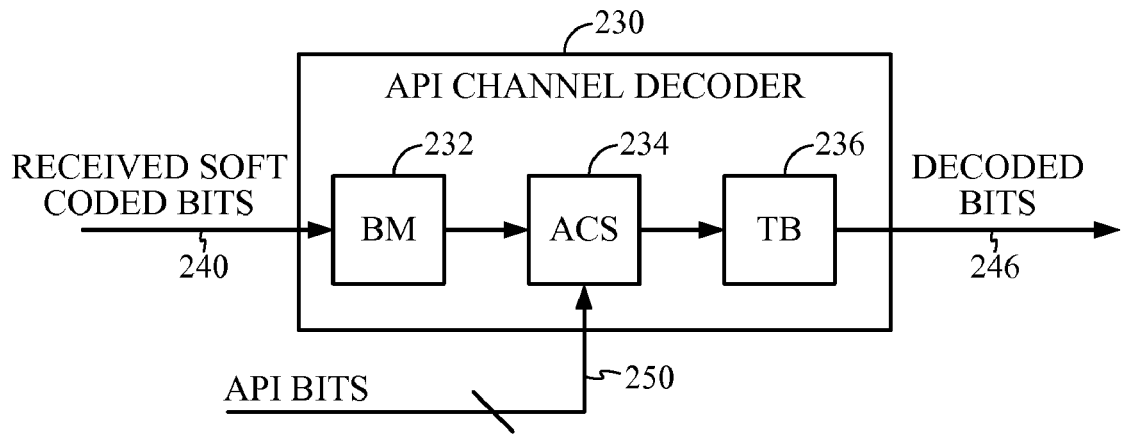
FIGS. 4A and 4B illustrate block diagrams of a-priori decoders in accordance with certain embodiments of the present disclosure.

FIG. 4A is a block diagram of a decoder 230 capable of performing decoder operations based on a-priori information in accordance with certain embodiments of the present application. While the illustrated example shows a Viterbi decoding scheme as an example, the a-priori decoding techniques presented herein may also be applied to other type of decoding schemes, such as Turbo coding/decoding, LDPC coding/decoding, RS coding/decoding, BCH coding/decoding, and various other schemes.

In the case of schemes that utilize systematic codes, coded bits may include systematic bits (information before encoding) and parity bits (redundancy bits resulting from encoding). API decoding scheme may be applied to the systematic bits. In other words, API bit values may include known values of the systematic bits based on the particular systematic codes used. To apply API for systems utilizing systematic codes, bits of received data may be replaced with (known/predicted) API bit values at the front end of the decoder. In this manner, the probability of successful decoding may be increased using API for systematic decoders.

The decoder 230 includes a branch metric unit 232, add compare select (ACS) logic 234, and a traceback unit 236 to generate a set of decoded bits 246 from a set of "soft (or hard)" received/encoded bits 240. The branch metric unit generally functions to calculate branch metrics, which represent normalized distances between a received symbol (set of bits) and symbols in a code alphabet. The ACS unit 234 generally compiles branch metric data to generate metrics for decoding paths ($^K$–1 paths, assuming a constraint length of K) and selects one of these decoding paths as optimal. The results of these selections are written to memory of a traceback unit 236, which restores a path from the stored decisions. A set of decoded bits can then be generated based on the transitions of the restored path.

One or more of the decoder components may be controlled by a set of API bits 250 in order to prevent the selection of decoding paths that correspond to bit values that are inconsistent with the a-priori information. In other words, the API bits 250 may contain sufficient information to indicate particular values ("0" or "1") that are known for certain bit locations in a sequence of bits being decoded. Any bit string that has a value other than the value specified in the API bits 250 is not a valid decoded bit string. Thus, the decoder may remove decoding paths corresponding to these invalid bit strings from consideration during path selection.

Figure 4B:
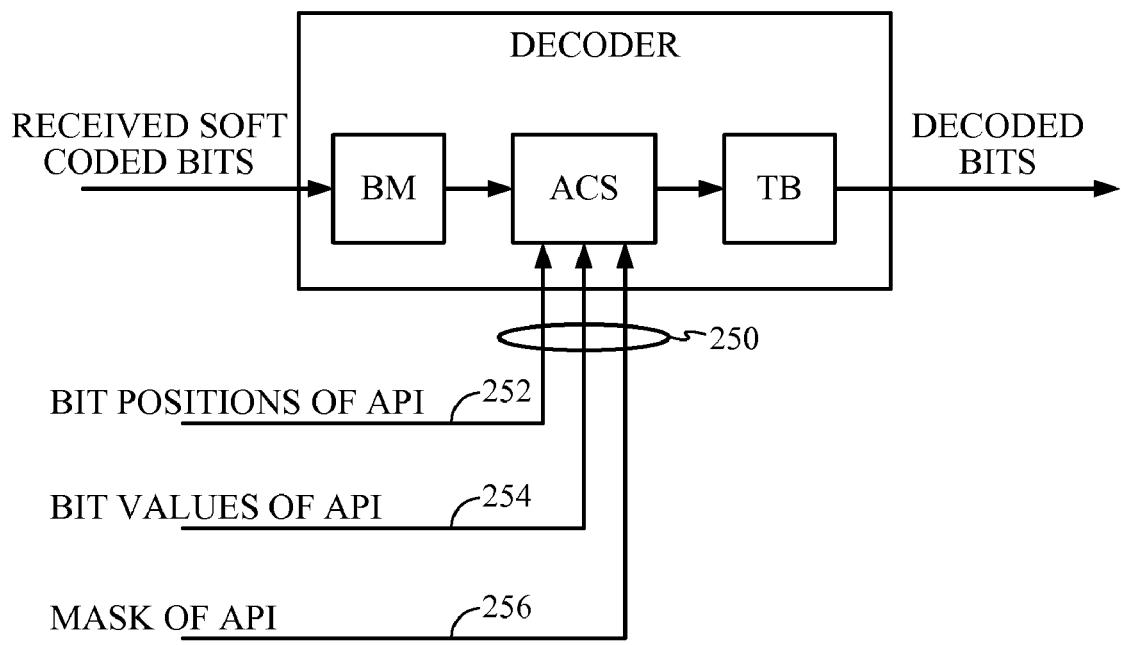

As illustrated in FIG. 4B, for certain embodiments, the ACS unit 234 may be controlled by API bits 250 in order to exclude decoding paths that correspond to invalid decoded bit strings. During ACS operation, the API bits 250 may be used to reduce particular decoding path transitions that correspond to encoded bit values that are inconsistent with the API values.

The API bits 250 generally include sufficient information to identify one or more bits in a decoded bit string that have bit values that are known (or predictable) based on a-priori information and, additionally, what those bit values are. The actual format in which this information is conveyed may vary with certain different embodiments and according to actual implementation schemes.

Figure 7:
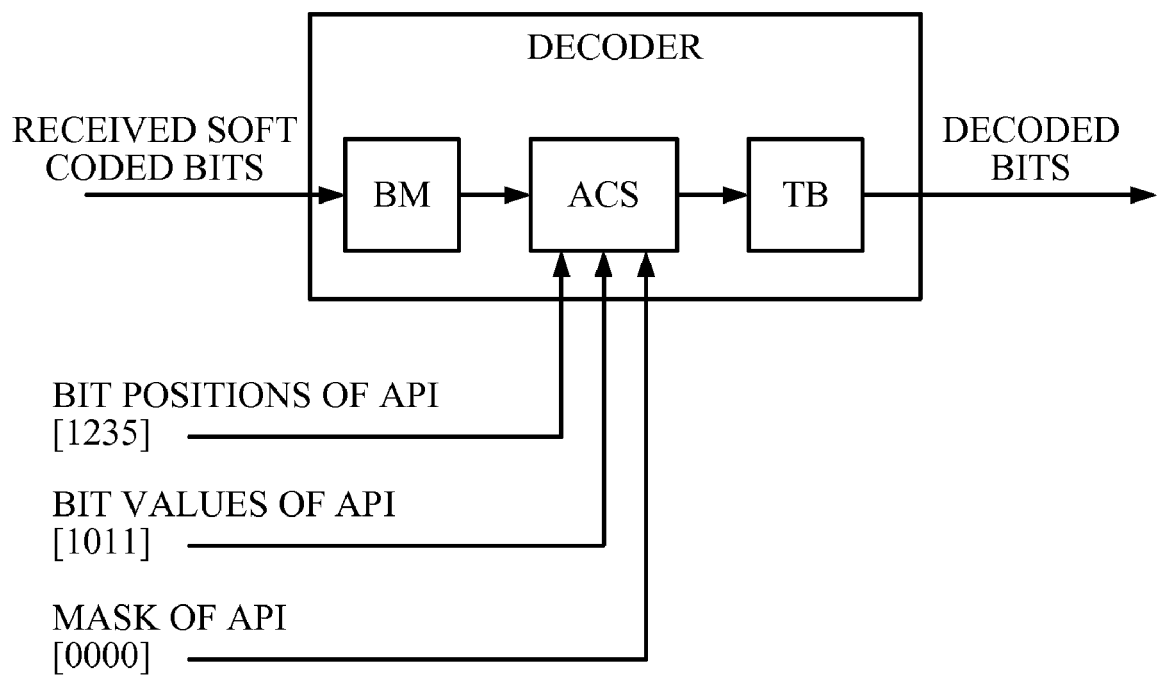
FIG. 7 illustrates the decoder of FIG. 5 with example values of a-priori information (API) bits.

For example, for certain embodiments, the API bits 250 may include three types of information: an indication of bit positions 252, bit values 254, and, optionally, API mask bits 256. The bit positions 252 may provide an indication of bit locations (within an encoded sequence) that have known values, while the bit values 254 provide the actual known values ("0" or "1") of an encoded bit. FIG. 7, described in detail below, provides an illustration with example values for bit positions, bit values, and mask bits according to this format.

The API bit positions 252 may identify bit positions correspond to the position of a known/predicted encoded bit in trellis structure. According to certain embodiments, the API bit positions 252 may explicitly identify bit positions that have known values, while all other bit positions are considered "unknown." The corresponding bit value of "0" or "1" in the bit values 254 may thus be used to identify valid transitions in the trellis structure and effectively remove decoding paths involving invalid transitions.

Figure 5:
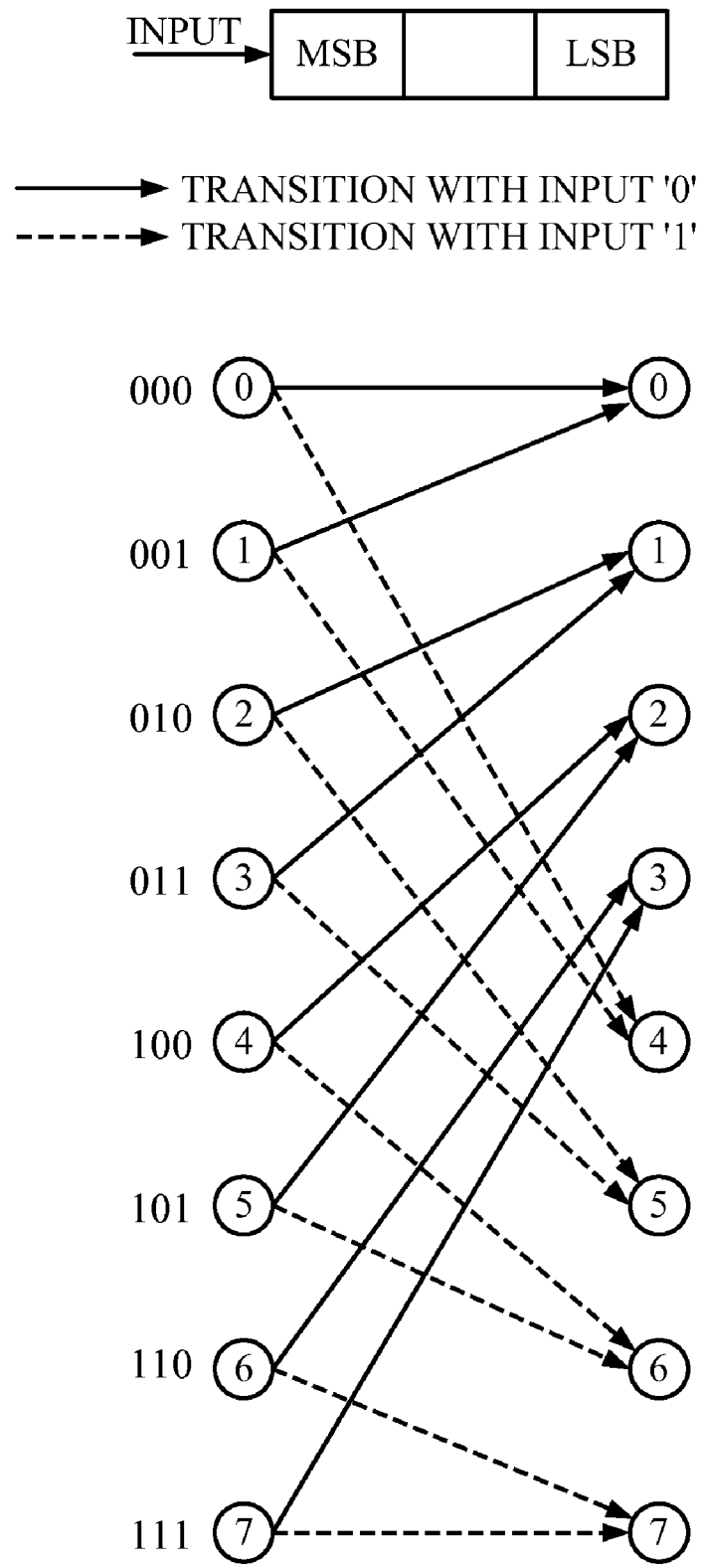
FIG. 5 illustrates an example of a state transition of a trellis diagram in accordance with certain embodiments of the present disclosure.

For example, FIG. 5 illustrates an example of a state transition of a trellis structure with 3-bit states. The illustrated example assumes a coding rate of 1/2 and a K=4 (with a 3-bit, K-1, state register). Solid arrows indicate state transitions corresponding to a "0" input bit, while dashed arrows indicate state transitions corresponding to a "1" input bit. According to API decoding, state transitions that correspond to input bits that are inconsistent with known values may be eliminated from consideration, thereby effectively eliminating any paths including these transitions from the final selection.

As an example, if a known API bit value for this state were a "0," the state transitions with solid lines will be evaluated, while the state transitions with dashed lines do not need to be calculated because they are part of invalid paths that should not be considered for selection. As described above, these transitions may be effectively eliminated at the next transition by setting the value of a state metric to a worst case value. In addition to reducing bit error rate by eliminating invalid paths from selection, eliminating the number of transitions based on API bit values can also reduce the number of computations in the ACS unit.

For certain embodiments, a mask function may be realized by utilizing the API mask bits 256 to identify bit positions whose API bit value should be ignored. Such a mask function may be useful and add flexibility, for example, when a standard changes causing a previously known bit value to become unknown. Setting the mask bit may provide a simple mechanism to efficiently accommodate such changes. A mask function may also be realized by manipulating the API bit positions 252 to remove the identification of a bit position that no longer has a known value, thus providing an alternative to changing a value in the bit mask value and/or eliminating the need for the bit mask value at all.

Figure 6:
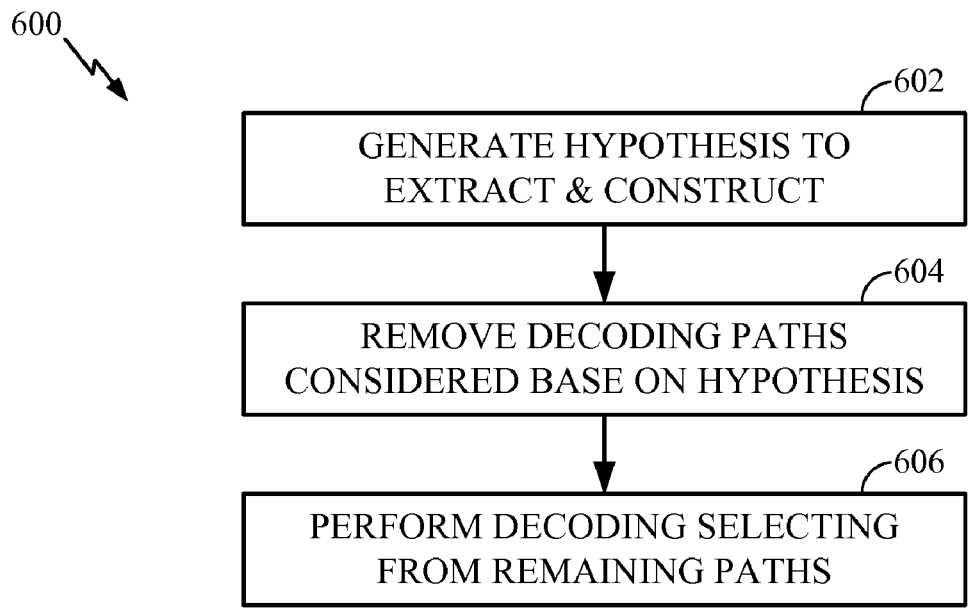
FIG. 6 is a flow diagram of example operations for a-priori decoding in accordance with certain embodiments of the present disclosure.

FIG. 6 illustrates example operations 600 for API decoding. The operations begin, at 602, by generating a hypothesis based on a-priori information. At 604, decoding paths that result in bit values inconsistent with the API bit values of the hypothesis are removed. Finally, at 606, decoding is performed based on a selection of one of the remaining paths.

As used herein, the term hypothesis generally refers to a particular set of API bits, for example, indicating bit positions with known values and specifying the values for those bits. As will be described in greater detail below, for certain embodiments, separate logic (referred to herein as a "Hypothesis Engine") may be provided to generate one or more hypotheses, for example, based on message information from a MAC Processor.

FIG. 7 illustrates one example of a hypothesis for a 6-bit stream applied to an API decoder. The illustrated hypothesis indicates, via API bit position values [1 2 3 5], that API bit values are present at bit positions 1, 2, 3, and 5 for use in decoding. According to the illustrated scheme, the corresponding API bit values [1 0 1 1] indicate the bit values for bits at these positions are: bit1=1, bit2=0, bit3=1, and bit5=1. For certain embodiments, API mask bit values of [0 0 0 0] may be used indicate that no masking function is applied to any of the bits. On the other hand, to exclude a bit from the API decoding, a mask bit could be set, for example to [0 0 0 1] to mask bit position 5, resulting in effective bit values of [1 0 1 X].

Of course, API mask functionality may be realized by controlling the API bit position values, as well. As an example, bit position 5 may also be effectively masked out by removing 5 from the bit position values, resulting in bit position values of [1 2 3], with corresponding API bit values [1 0 1]. In this scheme, API bit positions may be effectively masked without the need for a separate mask value data structure.

In an alternative scheme, only the API bit values and corresponding API mask values may be used. As an example, it may be assumed that all positions in a bit sequence are used for API decoding, for example, by default or by express indication of all bit positions in the API position value (e.g., [1 2 3 4 5 6]). In either case, the API mask values may be used to identify bit positions that have no corresponding API bit values. For example, the API mask value of [0 0 0 1 0 1] may be used with the "1" values indicating the API bit values corresponding to bit positions 4 and 6 should be ignored, resulting in corresponding API bit values of [1 0 1 X 1 X].

Figure 8:
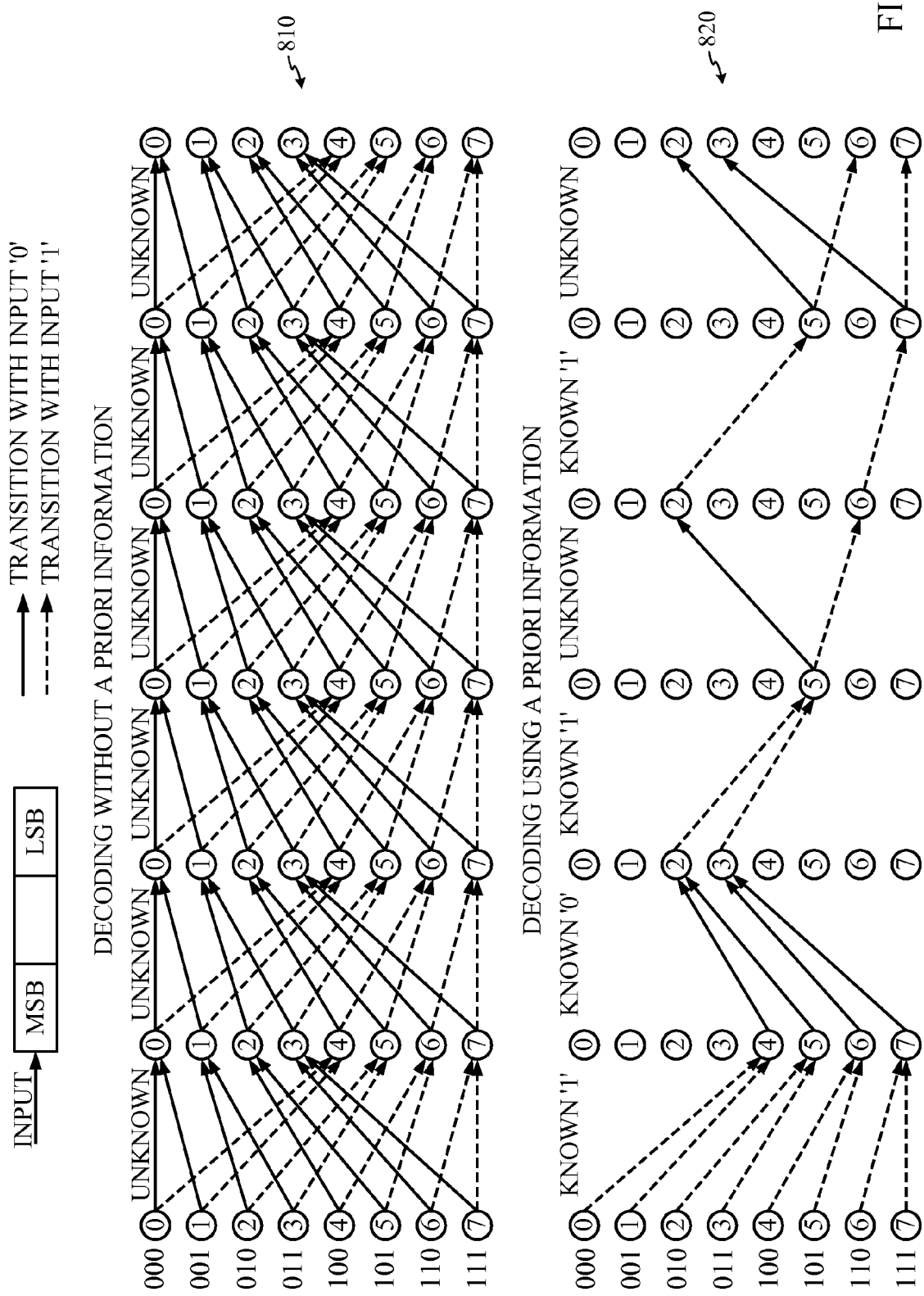
FIG. 8 illustrates an example of a Trellis diagram with a full set of decoding paths and a set of decoding paths that has been reduced based on a-priori information bits, in accordance with certain embodiments of the present disclosure.

FIG. 8 illustrates how the API bit values of the hypothesis shown in FIG. 7 may be applied to reduce the number of decoding paths considered during decoding. The top diagram 810 shows all possible paths through the diagram that would be considered in a conventional decoding scheme that assumes all input bits are unknown. As illustrated by the bottom diagram 820, however, an API decoding scheme searches a greatly reduced number of paths, having eliminated a number of path transitions based using the known API bit values. In FIG. 8, the 8 states corresponding to each node are shown as three digit binary number (i.e., 000, 001, 010, 011, 100, 101, 110, and 111).

The reduction in paths based on the API bit values may be explained by traversing the diagram 820 from left to right. The known API values for the corresponding transitions are listed across the top. For the first transition, the bit value is a known "1" resulting in removal of the solid line path transitions corresponding to a zero input bit. This results in transitions to state nodes 100$b$, 101$b$, 110$b$ and 111$b$ (with "b" denoting binary notation).

The second transition corresponds to a known bit value of "0" resulting in removal of the dashed line path transitions. This results in transitions to state nodes 010$b$ and 011$b$. The third transition corresponds to a known bit value of "1" resulting in removal of the solid line path transitions. This results in transitions to a single state node 101$b$.

The bit value for the fourth transition, however, is unknown. Therefore, both possible transition paths are evaluated. This results in transitions to state nodes 010$b$ and 110$b$. The fifth transition corresponds to a known bit value of "1" resulting in removal of the solid line path transitions. This results in transitions to state nodes 101$b$ and 111$b$. The bit value for the sixth transition is again unknown. Therefore, both possible transition paths are evaluated, resulting in transitions to state nodes 010$b$ and 110$b$ from state node 101$b$ and transitions to state nodes 011$b$ and 111$b$ from state node 111$b$.

Branch metrics for these remaining paths can be evaluated to select an optimal path and generate the corresponding set of decoded bits. By eliminating decoding paths that correspond to invalid bit sequences, bit/packet error rates may be improved using API decoding, with greater improvements expected in noisier environments.

Hypothesis Engine

As described above, for certain embodiments, a Hypothesis Engine may be provided to generate "hypotheses" that each includes a set of API bit values to use in performing API decoding. Depending on a particular implementation, a Hypothesis Engine may generate a single hypothesis or multiple hypotheses that may differ in which bits have known values and what those bit known values are. Evaluating multiple hypotheses may be useful, for example, when there are only a limited number of valid bit combinations, for a given sequence.

Figure 9:
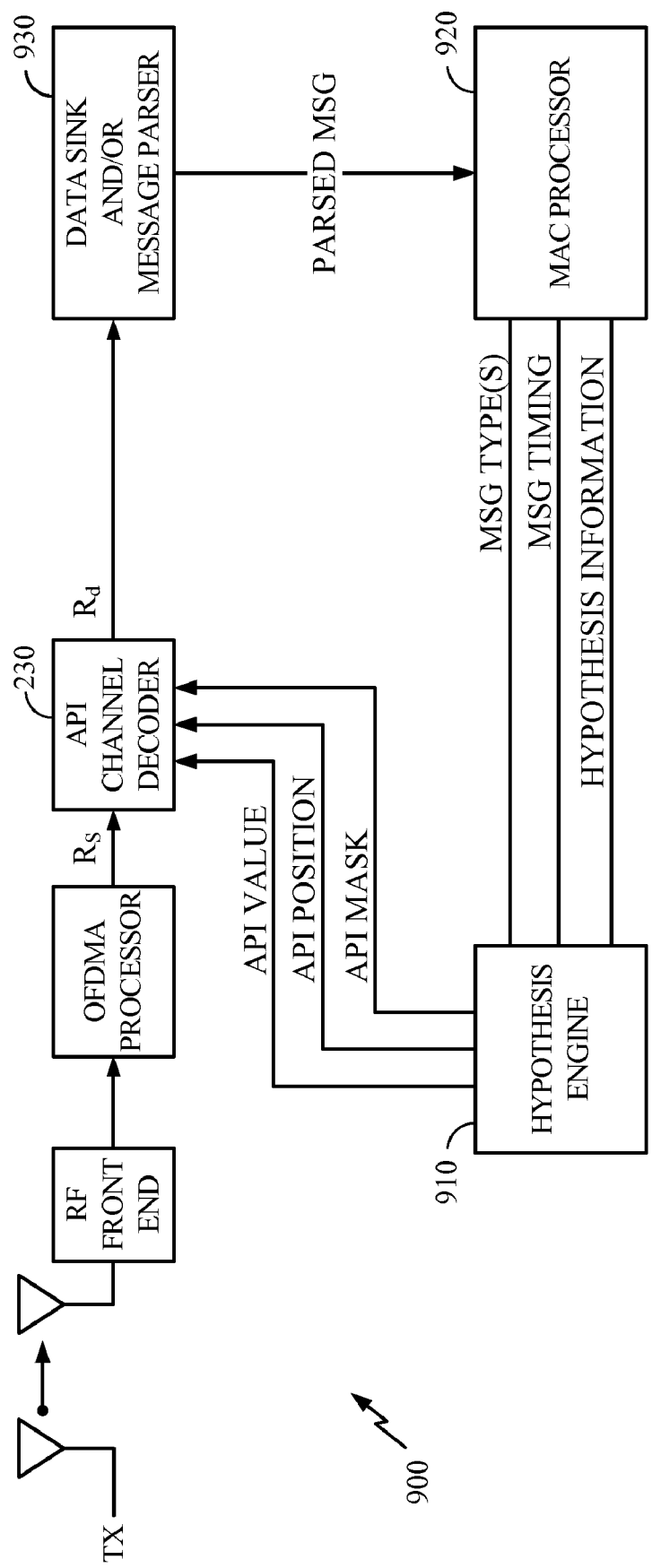
FIG. 9 is a block diagram of a receiver with an a-priori decoder and Hypothesis Engine in accordance with certain embodiments of the present disclosure.

FIG. 9 illustrates a receiver circuit 900 that includes an API decoder 230 and a Hypothesis Engine 910. As illustrated, the Hypothesis Engine 910 may receive information regarding a message from a medium access control (MAC) processor 920 and generates API bit values (a hypothesis) for use by the API decoder 230. The API decoder 230 starts to decode received soft (or hard) bits Rs using the API bit values provided by the Hypothesis Engine 910. The API decoder 230 outputs decoded data bits Rd, which are delivered to a message parser 930.

If the message parser 930 detects that the decoded bits are for a kind of message, the message is parsed and delivered to a MAC (medium access control) processor 920. The MAC Processor 920 may function as a type of protocol analyzer, analyzing the received data, for example, in an effort to determine what the next possible message type(s) are and what the timing will be.

As an example, the MAC Processor 920 may recognize the next incoming message (or data) will be ACK frame, which is sent as a response of Data frame (i.e., a transmitted message containing a data payload). In some cases, the MAC Processor 920 may use some information from a previous frame, for example, to determine a coding rate, message length, or some other parameter. The MAC Processor 920 may provide this information to the Hypothesis Engine 910 that will use it to extract known bit values (or predict bit values) for particular bit locations and generate API information to forward to the API decoder.

Figure 10:
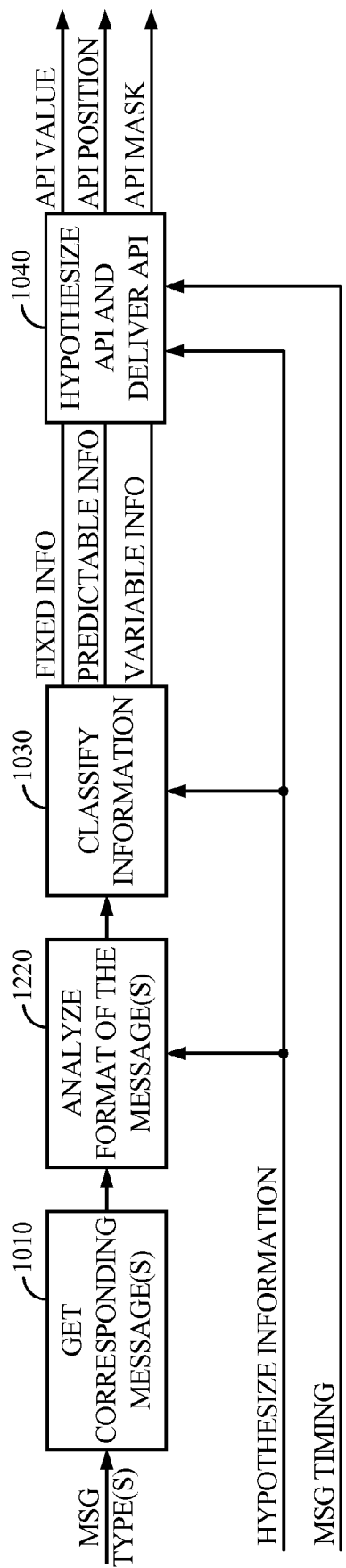
FIG. 10 is a block diagram of a Hypothesis Engine in accordance with certain embodiments of the present disclosure.

FIG. 10 illustrates example components of the Hypothesis Engine 910 that may be used to generate decoding hypotheses based on a-priori information and message information provided by the MAC Processor 920. As illustrated, the Hypothesis Engine receives an indication of a message type and includes logic 1010 to retrieve the corresponding message(s) designated by the message type and the format of the message (s) are analyzed by format logic 1020.

For certain embodiments, in addition to bit locations with fixed/known bit values (such as reserved bits set to a known value according to a standard), hypotheses may be generated with information that is predictable. As an example, bit information may be predictable based on a value from a previously received message (e.g., a coding type may not likely change from one message to the next).

Thus, classify logic 1030 may classify bit information in a given message into at least three categories: fixed information, predictable information, and variable information. The fixed (known) information generally refers to information that is fixed so that it is known 100% from initial stage or some bit values that are known under some conditions (e.g., after checking the decoding results of related messages). For example, the decoded results of messages relating to data to be decoded, such as messages or data that are known to be positioned before the data to be decoded, may be analyzed and API information may be extracted from the analyzed data.

The predictable information may include information that can be predictable under certain conditions or assumptions so it could provide different candidate values or bit combinations for a set of one or more bits. Different candidate values may be included in different hypotheses. For example, the predictable information may include some information predictable under certain conditions or assumptions or information that is predictable after checking decoding results of related messages.

Variable information generally includes information that is unknown or too difficult to predict so it is generally not used as API bit values (e.g., the API bit position values for these bit locations may be set to "0"). After classifying the information bits, Hypothesis API and Delivery logic 1040 of the hypotheses engine may generate a set or sets of API bit values (each set corresponding to a hypothesis) using the classified information. For example, the logic 1040 may construct the API bit location, bit value, and mask strings, to be output to the decoder 230.

API-Decoding Based on Expected 802.11 Messages

The API decoding scheme presented herein may be applied to decode a variety of different types of messages of which one or more bits may be known a-priori. For example, API decoding may be applied to decode acknowledgment (ACK) and clear to send (CTS) messages that a receiving station expects at certain times in an 802.11 environment. Because these messages are expected at known times and the format of these messages is known, the value of one or more of the bits may be known or easily predicted and, thus, may be used to generate API hypotheses for decoding purposes.

These hypotheses may be used to reduce the number of decoding paths considered by a decoder. As descried above, the number of decoding paths may be reduced in a convolutional trellis decoding scheme by manipulating branch metric values to give a very small likelihood value (or very large distance value) to a branch if the input bit of the branch is known and the input bit is not same as the known bit. This approach may increase the accuracy in decoding and recognizing ACK and CTS messages.

ACK and CTS messages play a key role in the fundamental access scheme of IEEE 802.11 MAC (Medium Access Control) layer, which is a DCF (Distributed Coordination Function) known as CSMA/CA (Carrier Sense Multiple Access/Collision Avoidance). According to this scheme, before a station (STA) will transmit, it will sense the medium to determine if another STA is transmitting. If the medium is not determined to be busy according to some specified timing requirements, the transmission may proceed.

Figure 11A:
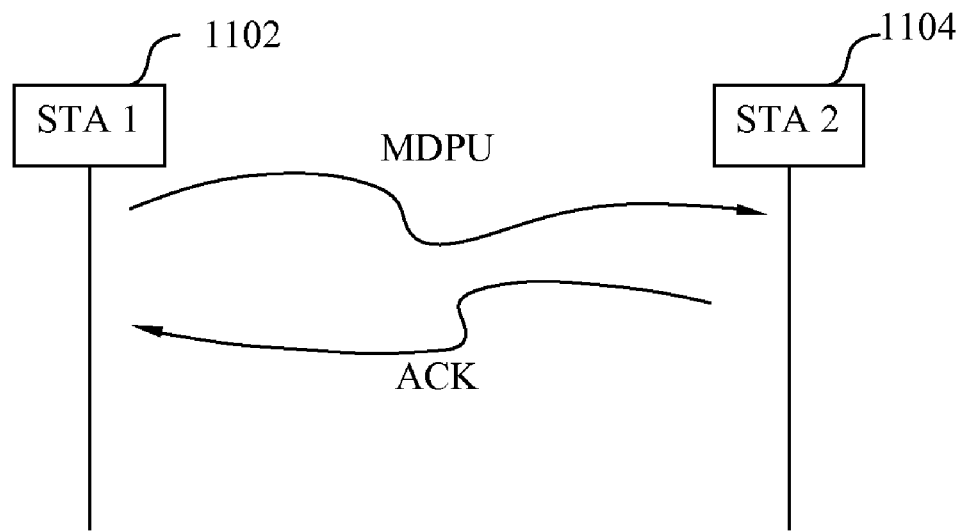
FIGS. 11A and 11B illustrate example messages exchanged in an 802.11 environment.

In some cases, as illustrated in FIG. 11A, transmitting and receiving STAs (e.g., an access point and subscriber station) may exchange RTS and CTS frames after determining that the medium is idle prior to data transmission in order to reserve the medium for certain time duration. In the illustrated example, STA1 1102 will not begin to transmit unless it receives a CTS from STA2 1104. If STA1 1102 does not receive a CTS within a predetermined amount of time, STA1 will re-transmit an RTS.

Figure 11B:
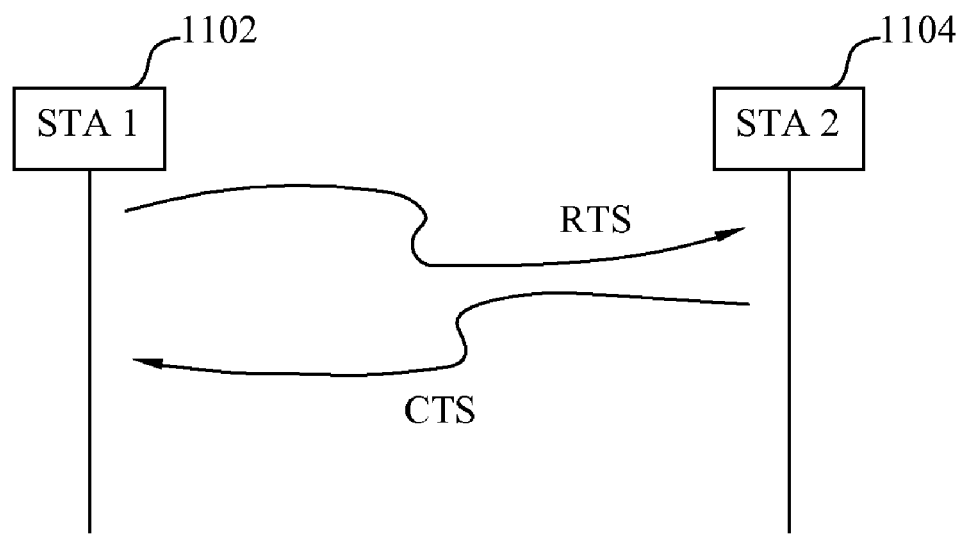

In addition, in some 802.11 applications, all directed traffic exchanges use positive acknowledgment (ACK) frames, wherein a transmitting STA will re-transmit data frames if they are not acknowledged (via an ACK) by the receiving STA. As illustrated in FIG. 11B, STA2 1104 may send an ACK after receiving a data message (e.g., an MAC protocol data unit—MPDU) from STA1 1102.

When a STA as a transmitter fails to receive ACK frame from the receiver, it has to perform a back off procedure and the retransmit the previous sent frame, which may reduce throughput significantly. Other stations are also affected, because STAs that are not the destination of the ACK will wait EIFS (Extended Inter Frame Space) to start back off. Since the EIFS is longer than normal DIFS (DCF Inter Frame Space) which can be used when it received a frame correctly, the chance of obtaining medium resource for the STA will be reduced. Failing to properly decode and recognize a CTS, in response to an RTS, may impact the network in a similar manner. Thus, incorrectly decoding ACK and CTS messages by a station that is expecting them may result in unnecessary re-transmission of messages that consume system bandwidth.

However, since a STA knows when it is supposed to receive ACK or CTS, the STA can apply API decoding scheme for ACK and CTS frames. For certain embodiments, the likelihood of incorrectly decoding ACK and CTS messages may be significantly reduced by applying the API hypothesis and processing scheme described above to decode ACK and CTS messages.

Both Subscriber Stations (STAs) and Access Points (APs) may utilize such API decoding, which may significantly improve system performance by conserving overall system bandwidth. Even if a STA is not the transmitting station (that sent the data message or RTS) but has detected the frame requires the ACK or CTS, that STA also can expect that the corresponding frame will follow and can decode accordingly.

Figure 12:
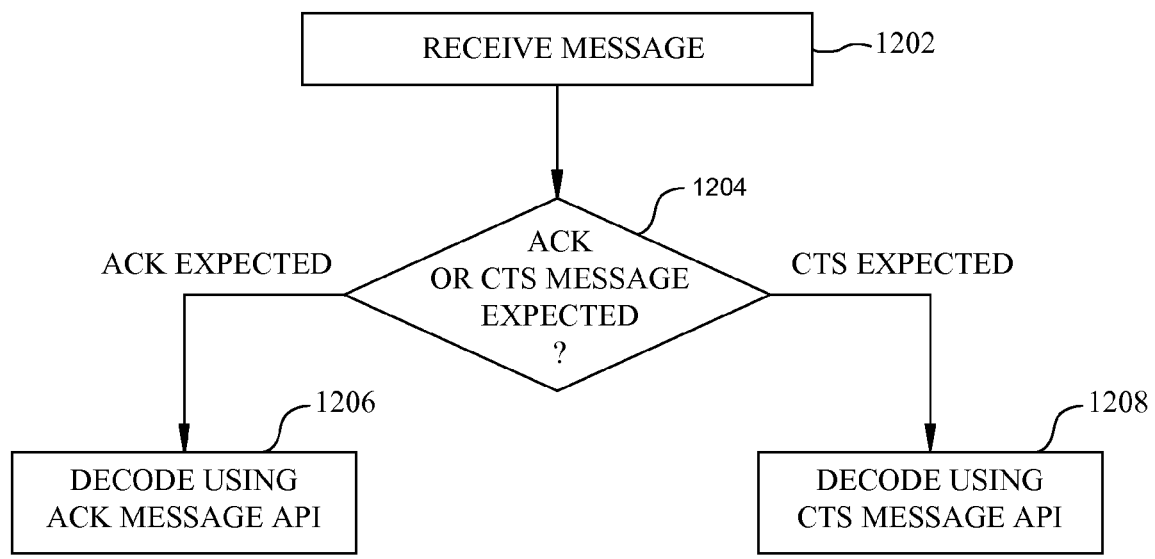
FIG. 12 illustrates example operations for a-priori information (API) decoding based on expected 802.11 messages in accordance with certain embodiments of the present disclosure.

FIG. 12 illustrates example operations 1200 for applying API decoding to certain messages, such ACK and CTS messages that are expected after sending data and RTS messages, respectively, in an 802.11 environment. The operations may be performed, for example, by the station expecting to receive the ACK and CTS messages in response to data messages or RTS message it sent out.

In addition or as an alternative, the operations may also be performed by other stations in the network that are not the original source station, but also receive the messages as described above. For example, other stations may "hear" an RTS message sent by a station and those other stations can also expect to hear the CTS sent in response. By performing API decoding based on known information about the expected response (such as the station address contained in the response), these other stations may also more accurately decode these expected response messages.

In any case, the operations begin, at 1202, by receiving a message. At 1204, a determination is made as to whether an ACK or CTS message is expected. If an ACK message is expected, the received message is decoded using API for the ACK message, at 1206. In other words, the received message may be decoded using one or more API hypotheses generated based on known bit values of the expected ACK message, as will be described in greater detail below with reference to FIG. 13.

If a CTS message is expected, the received message is decoded using API for the CTS message, at 1208. In other words, the received message may be decoded using one or more API hypotheses generated based on known bit values of the expected CTS message, as will be described in greater detail below with reference to FIG. 14.

The determination of whether an ACK or CTS message is expected may be indicated, for example, by message type (MSG TYPE) and message timing (MSG TIMING) indications (shown in FIG. 9 and 10 described above) provided by the MAC controller in the API decoder. As described above, a hypothesis engine may generate one or more sets of API bits (hypotheses) based on the API information for the expected response.

An ACK frame may be generated and transmitted after a Short Inter-Frame Space (SIFS) period after a successful reception of a frame type that requires acknowledgement. According to the 802.11 Standard, the source STA shall wait ACKTimeout amount of time without receiving an ACK frame before concluding that the data message failed to reach the destination station successfully.

A STA that is addressed by an RTS frame will transmit the CTS frame after a SIFS period if the Network Allocation Vector (NAV) at the STA receiving the RTS frame indicates that the medium is idle. If the NAV at the STA receiving the RTS indicates the medium is not idle, that STA will not respond to the RTS frame. The receiver address (RA) field of the CTS frame will be the value obtained from the transmitter address (TA) field of the RTS frame to which this CTS frame is a response.

The Duration/ID field in the CTS frame will be the duration field from the received RTS frame, adjusted by subtraction of an SIFSTime value and the number of microseconds required to transmit a CTS frame at the data rate used for the RTS frame to which this CTS frame is a response.

Figure 13:
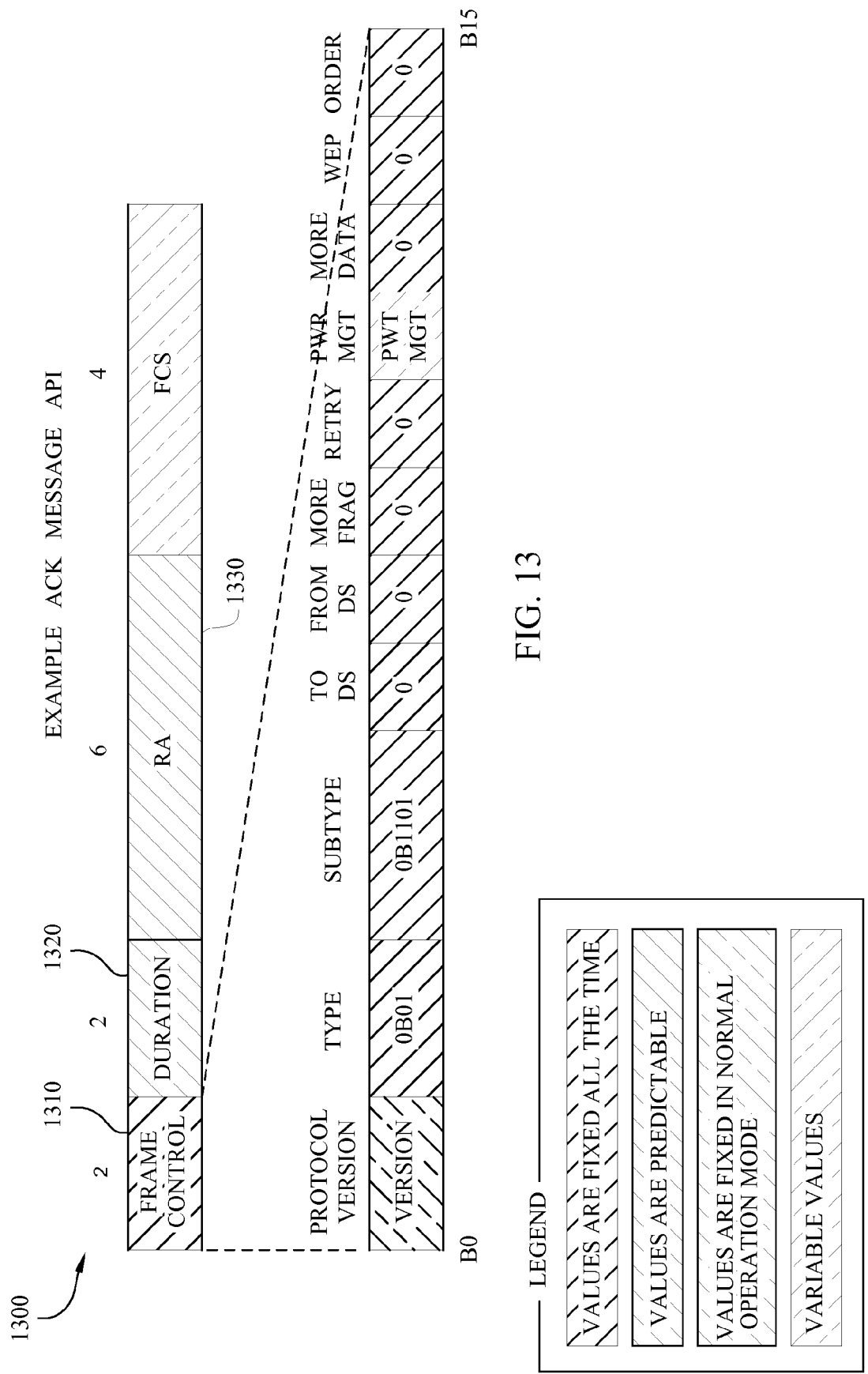
FIG. 13 illustrates an example ACK message format that may be used to generate decoding hypotheses based on a-priori information bits.

FIG. 13 illustrates an example ACK message format 1300 that may be expected at certain times (e.g., by stations in an 802.11 environment) and the type of information that may be used as API information for decoding purposes. The ACK message frame may include several fields that have fixed values, at least according to a particular protocol version. Thus, these fields may be used to generate hypotheses for an API decoder based on the known bit values.

As illustrated, the ACK frame may include a Frame Control field 1310, which may include a number of API bit values. These API bit values may include known/predicted values for a number of fields, such as a Protocol Version, Type, Subtype, ToDS bit, FromDS bit, MoreFrag bit, Retry bit, PwrMgt bit, MoreData bit, WEP bit, and an Order bit. Many of these fields (e.g., but for Protocol Version and PwrMgt) may have fixed values for the ACK frame, as shown in FIG. 13. Further, the Protocol Version may also be treated as a fixed value after successful association to the AP station.

As illustrated, the Frame Control field may be followed by a Duration field 1320 which can be predicted from the More-Frag bit and Duration field of a previous frame. The station that is the destination of the ACK frame will know the duration. Other stations (expecting an ACK because the "heard" another station transmit a data packet) may examine values from a unicast frame to determine a MoreFrag and Duration value. If the MoreFrag bit is zero, the Duration field of the ACK is expected to be zero. If the MoreFrag bit is one, the Duration value may be used to calculate the Duration value of the following (expected) ACK frame.

As illustrated, the Duration field may be followed by a Receiver Address (RA) field 1330 which is the destination of the ACK frame. Obviously, the station that sent a requiring an ACK response will know the RA shall be its own MAC address. The other stations that are listening may also know the RA to expect based on the Transmitter Address (TA) of the previous frame that requires the ACK.

Figure 14:
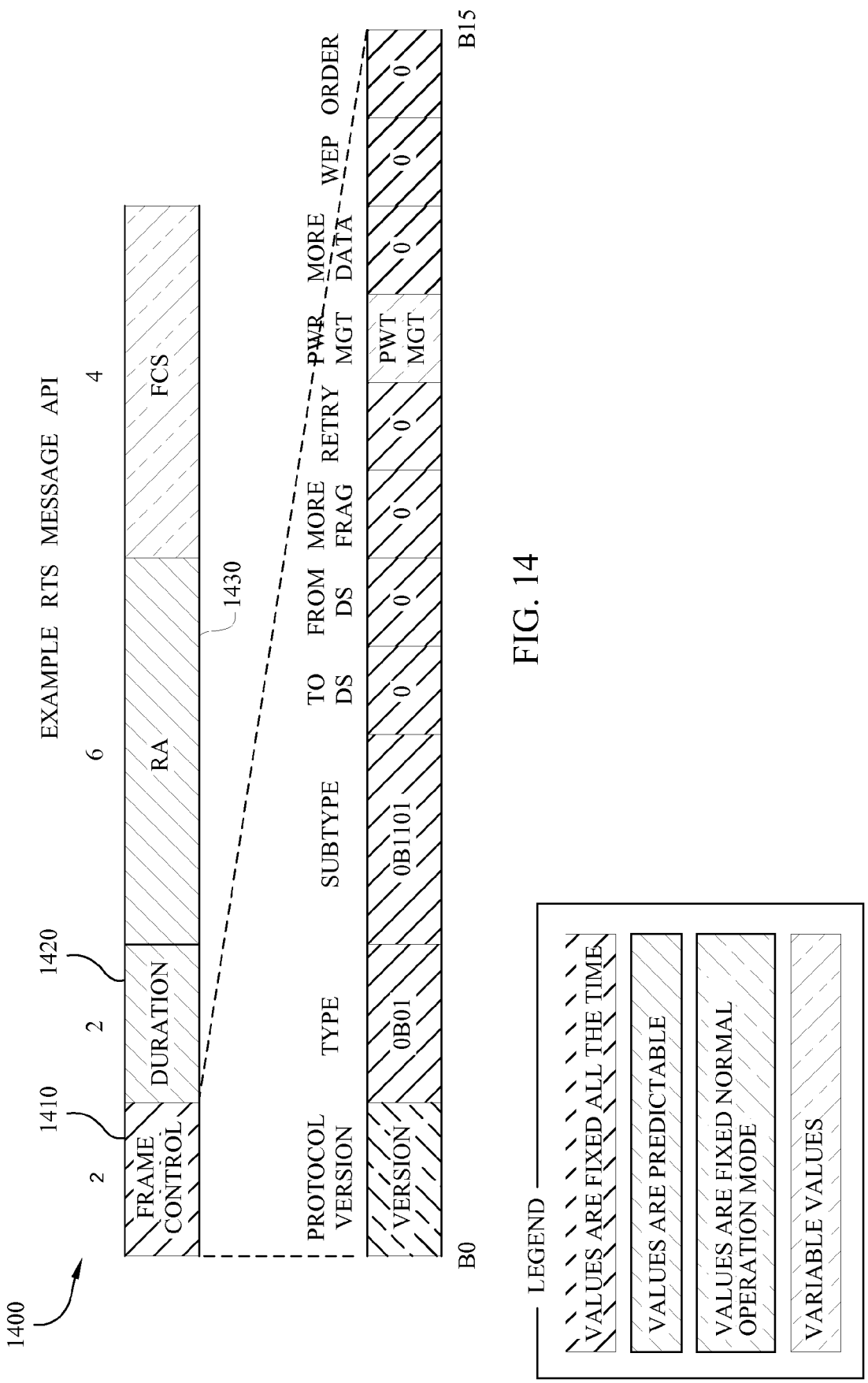
FIG. 14 illustrates an example CTS message format that may be used to generate decoding hypotheses based on a-priori information bits.

FIG. 14 illustrates an example CTS message format 1400 and the type of information that may be used as API information for decoding purposes. As with the ACK message, the CTS message may also include a Frame Control field 1410, Duration field 1420, and an RA field 1430 with known/predictable values, as described above.

The value of the Duration field may be predicted from the previous (RTS) frame Duration field. If a decoding station is the destination of the CTS frame, it will know the duration. If the decoding station is a different station that merely observed (or "heard") an RTS frame but was not the targeted station, as indicated the observed RA value, that station may be able to calculate the Duration value from the duration value of the previous (RTS) frame. The station that sent the RTS will know the RA value (in the CTS frame) is its own MAC address, while other stations may know the RA value in the CTS frame will be the same as the TA of the previously observed RTS frame.

Different combinations of the known/predictable bit values shown in FIGS. 13 and 14 may be used to generate a set of one or more hypotheses that may be used to eliminate decoding paths and help to more accurately decode ACK and CTS messages. More accurate decoding of ACK and CTS messages may help preserve network bandwidth by avoiding costly back off procedures and re-transmissions.

Figure 6A:
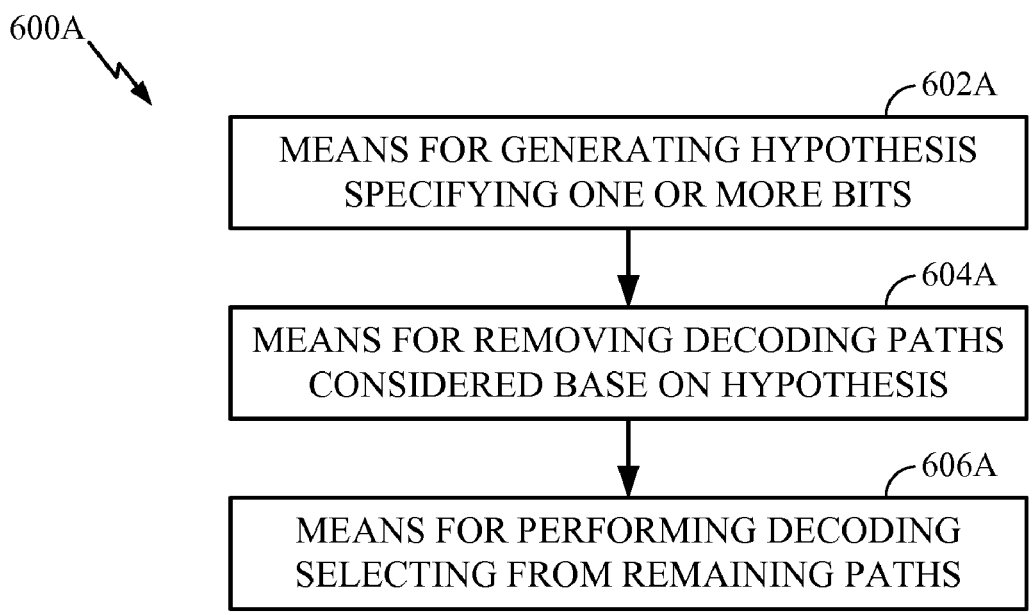
FIG. 6A is a block diagram of components capable of performing operations for a-priori decoding in accordance with certain embodiments of the present disclosure.

The various operations of methods described above may be performed by various hardware and/or software component (s) and/or module(s) corresponding to means-plus-function blocks illustrated in the Figures. Generally, where there are methods illustrated in Figures having corresponding counterpart means-plus-function Figures, the operation blocks correspond to means-plus-function blocks with similar numbering. For example, blocks 602-606 illustrated in FIG. 6 correspond to means-plus-function blocks 602A-60A illustrated in FIG. 6A.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

Information and signals may be represented using any of a variety of different technologies and techniques. For example, data, instructions, commands, information, signals and the like that may be referenced throughout the above description may be represented by voltages, currents, electromagnetic waves, magnetic fields or particles, optical fields or particles or any combination thereof.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core or any other such configuration.

The steps of a method or algorithm described in connection with the present disclosure may be embodied directly in hardware, in a software module executed by a processor or in a combination of the two. A software module may reside in any form of storage medium that is known in the art. Some examples of storage media that may be used include RAM memory, flash memory, ROM memory, EPROM memory, EEPROM memory, registers, a hard disk, a removable disk, a CD-ROM and so forth. A software module may comprise a single instruction, or many instructions, and may be distributed over several different code segments, among different programs and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in software, the functions may be stored as instructions or as one or more sets of instructions on a computer-readable medium or storage medium. A storage media may be any available media that can be accessed by a computer or one or more processing devices. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein, such as those illustrated in the Figures, can be downloaded and/or otherwise obtained by a mobile device and/or base station as applicable. For example, such a device can be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a mobile device and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims While the foregoing is directed to embodiments of the present disclosure, other and further embodiments of the disclosure may be devised without departing from the basic scope thereof, and the scope thereof is determined by the claims that follow.

What is claimed is:

1. A method for decoding encoded data bits of a wireless communication transmission for a response message expected to be transmitted in response to a transmitted message, comprising:
    generating a hypothesis specifying a set of bit values of the encoded data bits based on a-priori information regarding the expected response message, wherein the a-priori information is extracted from the transmitted message; and
    decoding the expected response message by eliminating from consideration sets of decoded bits that are inconsistent with the specified bit values and selecting, as output, decoded bits that are consistent with the bit values specified by the hypothesis, wherein the transmitted message comprises a data payload and the expected response message comprises an acknowledgement (ACK) message.

2. The method of claim 1, wherein generating the hypothesis comprises:
    specifying one or more bit values based on one or more values in a frame control field of the expected response message that are fixed according to a wireless communications standard.

3. The method of claim 1, wherein generating the hypothesis further comprises:
    specifying one or more bit values based on a receiver address field value.

4. The method of claim 3, further comprising:
    predicting, at a first station, the receiver address field value based on a transmitter address field value observed in a message transmitted by a second station.

5. The method of claim 2, further comprising:
    predicting, at a first station, a duration field value based, at least in part, on a duration field value observed in a message transmitted by a second station.

6. A receiver capable of decoding encoded data bits of a wireless communication transmission for a response message expected to be transmitted in response to a transmitted message, comprising:
    logic for generating a hypothesis specifying a set of bit values of the encoded data bits based on a-priori information regarding the expected response message, wherein the a-priori information is extracted from the transmitted message; and
    logic for decoding the expected response message by eliminating from consideration sets of decoded bits that are inconsistent with the specified bit values and selecting, as output, decoded bits that are consistent with the bit values specified by the hypothesis, wherein the transmitted message comprises a data payload and the expected response message comprises an acknowledgement (ACK) message.

7. The receiver of claim 6, wherein the logic for generating the hypothesis is configured to:
    specify one or more bit values based on one or more values in a frame control field of the expected response message that are fixed according to a wireless communications standard.

8. The receiver of claim 6, wherein the logic for generating the hypothesis is configured to:
    specify one or more bit values based on a receiver address field value.

9. The receiver of claim 8, further comprising:
    logic for predicting the receiver address field value based on a transmitter address field value observed in a message transmitted by a station.

10. The receiver of claim 7, further comprising:
    logic for predicting a duration field value based, at least in part, on a duration field value observed in a message transmitted by a station.

11. An apparatus for decoding encoded data bits of a wireless communication transmission for a response message expected to be transmitted in response to a transmitted message, comprising:
    means for generating a hypothesis specifying a set of bit values of the encoded data bits based on a-priori information regarding the expected response message, wherein the a-priori information is extracted from the transmitted message; and
    means for decoding the expected response message by eliminating from consideration sets of decoded bits that are inconsistent with the specified bit values and selecting, as output, decoded bits that are consistent with the bit values specified by the hypothesis, wherein the transmitted message comprises a data payload and the expected response message comprises an acknowledgement (ACK) message.

12. The apparatus of claim 11, wherein the means for generating the hypothesis is configured to:
   specify one or more bit values based on one or more values in a frame control field of the expected response message that are fixed according to a wireless communications standard.

13. The apparatus of claim 11, wherein the means for generating the hypothesis is further configured to:
   specify one or more bit values based on a receiver address field value.

14. The apparatus of claim 13, further comprising:
   means for predicting the receiver address field value based on a transmitter address field value observed in a message transmitted by a station.

15. The apparatus of claim 12, further comprising:
   means for predicting a duration field value based, at least in part, on a duration field value observed in a message transmitted by a station.

16. A non-transitory computer-readable medium containing instructions for a program for decoding encoded data bits of a wireless communication transmission for a response message expected to be transmitted in response to a transmitted message which, when executed by a processor, perform operations comprising:
   generating a hypothesis specifying a set of bit values of the encoded data bits based on a-priori information regarding the expected response message, wherein the a-priori information is extracted from the transmitted message; and
   decoding the expected response message by eliminating from consideration sets of decoded bits that are inconsistent with the specified bit values and selecting, as output, decoded bits that are consistent with the bit values specified by the hypothesis, wherein the transmitted message comprises a data payload and the expected response message comprises an acknowledgement (ACK) message.

17. The computer-readable medium of claim 16, wherein generating the hypothesis comprises: specifying one or more bit values based on one or more values in a frame control field of the expected response message that are fixed according to a wireless communications standard.

18. The non-transitory computer-readable medium of claim 16, wherein generating the hypothesis further comprises: specifying one or more bit values based on a receiver address field value.

19. The non-transitory computer-readable medium of claim 18, further comprising: predicting, at a first station, the receiver address field value based on a transmitter address field value observed in a message transmitted by a second station.

20. The non-transitory computer-readable medium of claim 17, further comprising: predicting, at a first station, a duration field value based, at least in part, on a duration field value observed in a message transmitted by a second station.

* * * * *